United States Patent
Ho et al.

(10) Patent No.: US 9,263,302 B2
(45) Date of Patent: Feb. 16, 2016

(54) VIA STRUCTURE FOR PACKAGING AND A METHOD OF FORMING

(71) Applicant: Taiwan Semiconductor Manufacturing Company, Ltd., Hsin-Chu (TW)

(72) Inventors: Ming-Che Ho, Tainan (TW); Yi-Wen Wu, Xizhi (TW); Chien Ling Hwang, Hsin-Chu (TW); Hung-Jui Kuo, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 64 days.

(21) Appl. No.: 14/186,698

(22) Filed: Feb. 21, 2014

(65) Prior Publication Data
US 2015/0243531 A1    Aug. 27, 2015

(51) Int. Cl.
| | |
|---|---|
| *H01L 21/00* | (2006.01) |
| *H01L 21/56* | (2006.01) |
| *H01L 23/00* | (2006.01) |
| *H01L 27/112* | (2006.01) |
| *H01L 27/02* | (2006.01) |

(52) U.S. Cl.
CPC .............. *H01L 21/565* (2013.01); *H01L 24/81* (2013.01); *H01L 27/112* (2013.01); *H01L 27/0207* (2013.01); *H01L 2924/181* (2013.01)

(58) Field of Classification Search
CPC ..... H01L 21/81; H01L 21/565; H01L 27/112; H01L 27/0207
USPC ................... 438/128, 129, 126, 127
See application file for complete search history.

(56) References Cited

U.S. PATENT DOCUMENTS

| | | | |
|---|---|---|---|
| 7,553,765 B2 * | 6/2009 | Komuro ................ | H01L 27/016 257/E21.008 |
| 2015/0041982 A1 * | 2/2015 | Hau-Riege ........ | H01L 23/53266 257/753 |
| 2015/0145140 A1 * | 5/2015 | Haba ................... | H01L 21/6835 257/774 |

* cited by examiner

*Primary Examiner* — Long K Tran
(74) *Attorney, Agent, or Firm* — Slater & Matsil, L.L.P.

(57) ABSTRACT

A via or pillar structure, and a method of forming, is provided. In an embodiment, a polymer layer is formed having openings exposing portions of an underlying conductive pad. A conductive layer is formed over the polymer layer, filling the openings. The dies are covered with a molding material and a planarization process is performed to form pillars in the openings. In another embodiment, pillars are formed and then a polymer layer is formed over the pillars. The dies are covered with a molding material and a planarization process is performed to expose the pillars. In yet another embodiment, pillars are formed and a molding material is formed directly over the pillars. A planarization process is performed to expose the pillars. In still yet another embodiment, bumps are formed and a molding material is formed directly over the bumps. A planarization process is performed to expose the bumps.

20 Claims, 9 Drawing Sheets

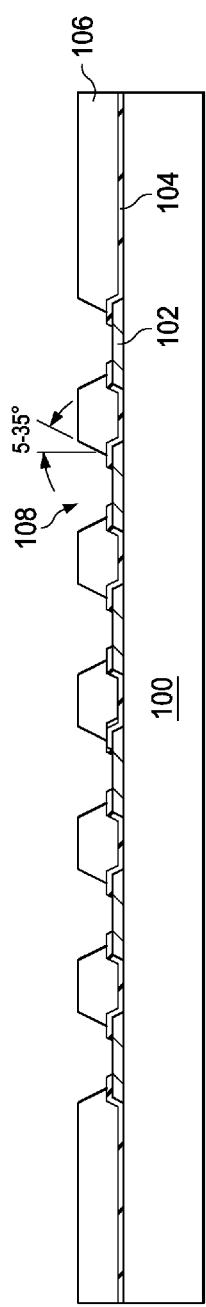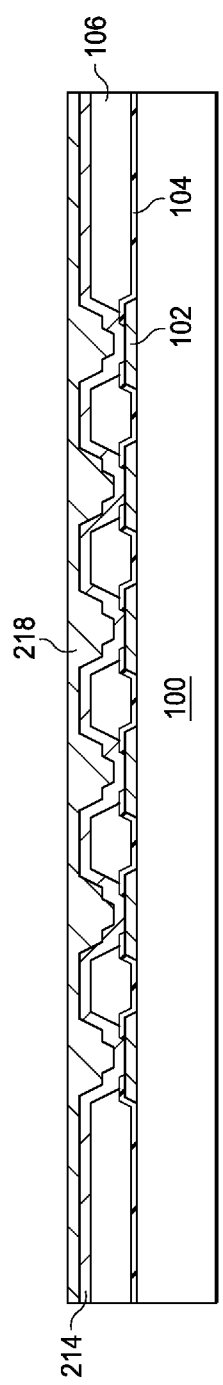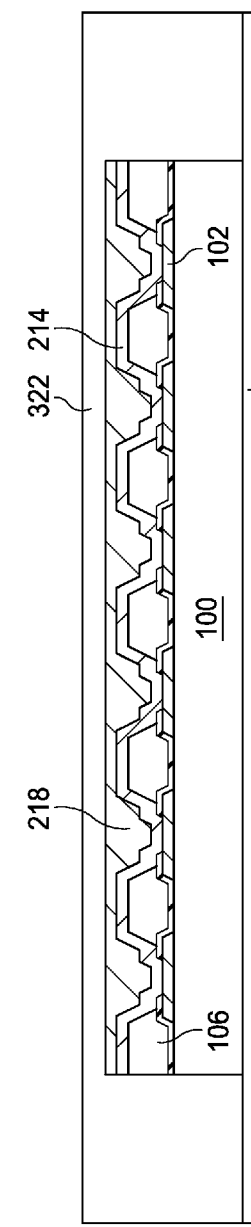

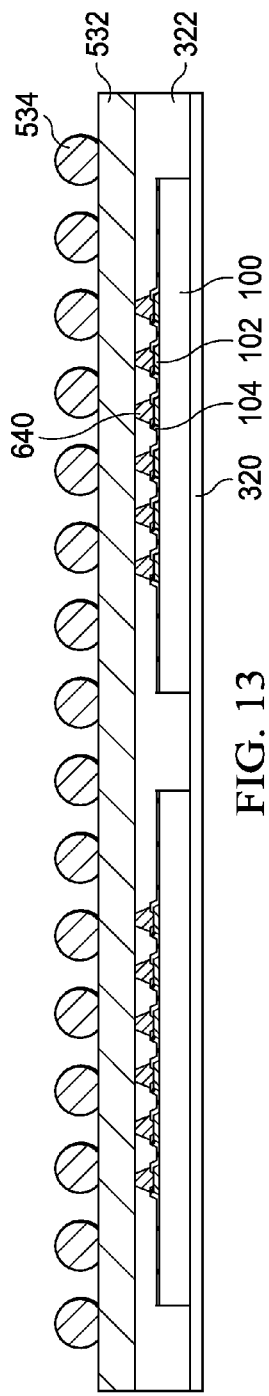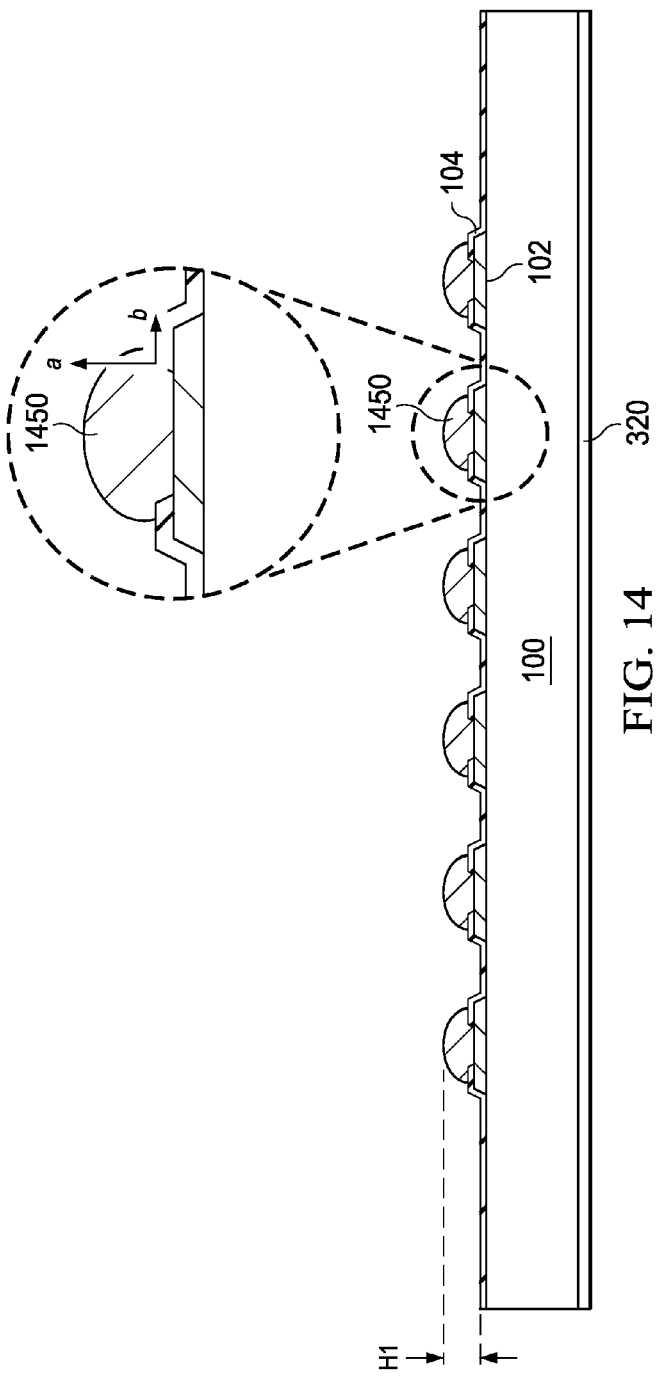

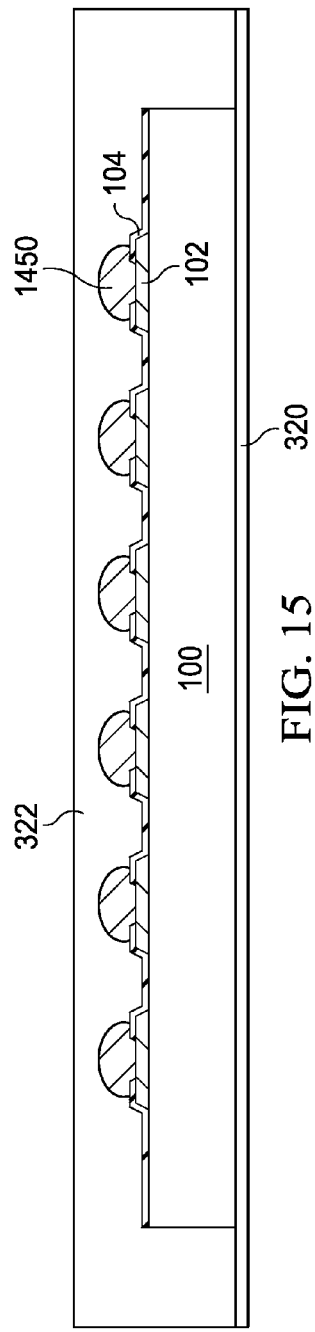
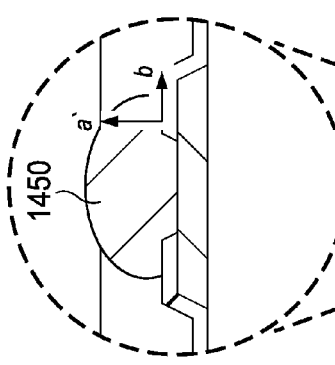
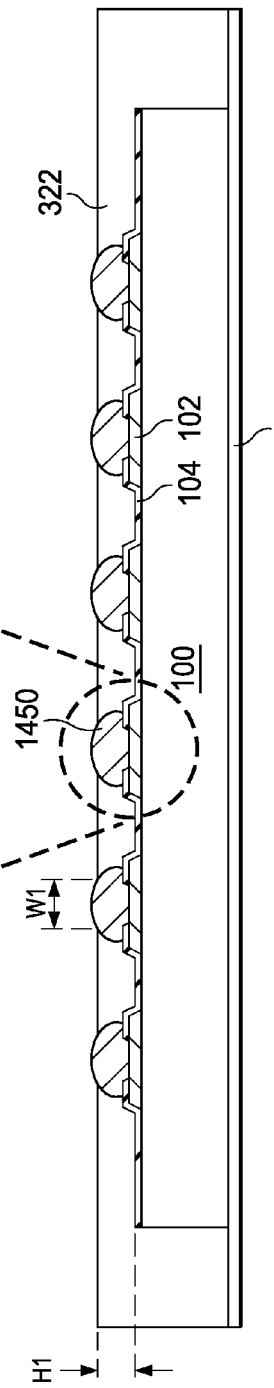

VIA STRUCTURE FOR PACKAGING AND A METHOD OF FORMING

BACKGROUND

A typical integrated circuit structure is made up of dies that include active devices such as transistors and capacitors. These devices are initially isolated from each other, and interconnect structures are later formed over the active devices to create functional circuits. On top of the interconnect structures, metal pads are formed and exposed on the surface of the respective die. Electrical connections are made through the metal pads to connect the die to a package substrate or another die.

In an aspect of conventional packaging technologies, such as fan-out packaging, redistribution layers (RDLs) may be formed over a die and electrically connected to the metal pads. Input/output (I/O) pads such as solder balls may then be formed to electrically connect to the metal pads through the RDLs. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1-5 illustrate intermediate stages in forming a semiconductor device in accordance with an embodiment;

FIGS. 11-13 illustrate intermediate stages in forming a semiconductor device in accordance with an embodiment;

FIGS. 14-17 illustrate intermediate stages in forming a semiconductor device in accordance with an embodiment;

DETAILED DESCRIPTION

Figure 4:
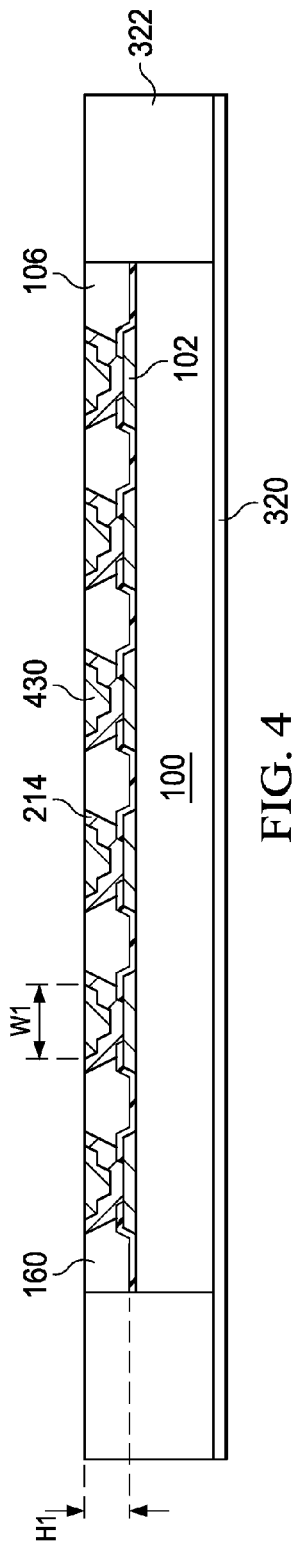

The making and using of embodiments are discussed in detail below. It should be appreciated, however, that this disclosure provides many applicable inventive concepts that can be embodied in a wide variety of specific contexts. The specific embodiments discussed herein are merely illustrative of specific ways to make and use the embodiments, and do not limit the scope of the disclosure.

Embodiments of the present disclosure relate to the use of forming thin pillars or vias or bumps to interconnect conductive pads of a die to balls or bumps in a package. While the disclosed embodiments are disclosed in the context of a fan-out design, other embodiments may be used in other applications. For example, other embodiments may be used in other configurations, such as a three-dimensional (3D) integrated circuit (IC) or stacked die configuration. Throughout the various views and illustrative embodiments of the present disclosure, like reference numbers are used to designate like elements.

FIGS. 1-5 illustrate various intermediate stages of fabrication of a semiconductor device with thin pillars formed therein in accordance with an embodiment. Referring first to FIG. 1, a portion of a substrate 100 is shown in accordance with an embodiment. The substrate 100 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as multi-layered or gradient substrates may also be used. In another embodiment, the substrate 100 may comprise a substrate to which an integrated circuit die may be attached. For example, the substrate 100 may include an interposer, a packaging substrate, a high-density interconnect, a printed circuit board, another integrated circuit die, or the like.

It should be noted that in some embodiments, particularly in embodiments in which the substrate 100 comprises an integrated circuit die, the substrate 100 may include electrical circuitry (not shown). In an embodiment, the electrical circuitry includes electrical devices formed on the substrate 100 with one or more dielectric layers overlying the electrical devices. Metal layers may be formed between dielectric layers to route electrical signals between the electrical devices. Electrical devices may also be formed in one or more dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application. In the case the substrate 100 is an interposer, the interposer may include passive elements, active elements, both active elements and passive elements, or neither.

Additionally, the substrate 100 may be a wafer upon which multiple dies may be formed and then separated, thereby forming individual integrated circuit dies. As such, the figures illustrate a single die for ease of illustration while it is understood that the die may be fabricated as part of a wafer.

Conductive pads 102 are provided in an upper surface of the substrate 100 to provide external electrical connections. It should be noted that the conductive pads 102 may represent an electrical connection to electrical circuitry formed on the substrate 100, an electrical connection to a through-substrate via, a redistribution line, and/or the like. The conductive pads 102 may comprise a conductive material such as copper, although other conductive materials, such as tungsten, aluminum, or a copper alloy may alternatively be used. The conductive pads 102 may be formed by any suitable process, such as a deposition and etching, damascene or dual damascene, or the like with any suitable conductive material, such as aluminum.

A passivation layer 104 may be formed of a dielectric material, such as polyimide, polymer, an oxide, a nitride, or the like, and patterned over the surface of the substrate 100 to provide an opening over the conductive pads 102 and to protect the underlying layers from various environmental contaminants. In an embodiment, the first passivation layer 104 comprises a composite layer of a layer of silicon nitride and an oxide layer. The silicon nitride layer may be formed using chemical vapor deposition (CVD) techniques using silane and ammonia as precursor gases to a thickness of about 2000 Å. The oxide layer may be formed by any oxidation process, such as wet or dry thermal oxidation in an ambient comprising an oxide, $H_2O$, NO, or a combination thereof, or by CVD techniques using tetra-ethyl-ortho-silicate (TEOS) and oxygen as a precursor. In an embodiment, the passivation layer has a thickness about 2.5 um to about 3.1 um.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, additional passivation layers, and the like, may be present. A single layer of conductive/bond pads and a passivation layer are shown for illustrative purposes only. Other embodiments may include any number of conductive layers and/or passivation layers. Furthermore, it should be appreciated that one or more of the conductive layers may act as a RDL to provide the desired pin or ball layout. The above description is meant only to provide a context for embodiments discussed herein and is not meant to limit the disclosure or the scope of any claims to those specific embodiments.

A polymer layer 106 is formed over the passivation layer 104 and patterned to form openings 108 in accordance with an embodiment. The polymer layer 106 will act as a mold for forming conductive pillars or vias in subsequent processing steps. In an embodiment, the polymer layer 106 is a polymer such as an epoxy, polyimide, benzocyclobutene (BCB), polybenzoxazole (PBO), and the like. In an embodiment in which the polymer layer is, for example, PBO, the polymer layer may be formed by spin coating to a thickness of about 2 μm to about 5 μm, for example, and patterned using photolithography techniques. PBO is a photosensitive material and may be patterned by exposing the PBO layer in accordance with a desired pattern, developing, and curing. As a result of these steps, including the curing, the sidewalls of the polymer layer 106 are tapered. These tapered sidewalls aid in achieving good step coverage of a subsequently formed liner. In an embodiment, sidewalls of the polymer layer have an angle of about 5° to about 35° relative to normal of a major surface of the second passivation layer 106 as illustrated in FIG. 1. The angle of the tapered sidewalls can be controlled by adjusting exposure conditions of the patterning step, such as by adjusting the exposure energy, exposure time, and curing conditions.

Referring now to FIG. 2, a liner layer 214 is formed over the surface of the polymer layer 106 and exposed portions of the conductive pads 102. The liner layer 214 is a thin layer of a conductive material that acts as a diffusion barrier layer and/or adhesion layer. The liner layer 214 further aids in the formation of a thicker conductive layer, such as a conductive layer 218, during subsequent processing steps. In an embodiment, the liner layer 214 may be formed by depositing a thin conductive layer, such as a thin layer of Ti, Ta, Cu, TiN, TaN, and/or the like, using CVD or PVD techniques. For example, in an embodiment, the conformal liner layer 214 comprises a layer of Ti deposited by a PVD process to a thickness of about 200 Å to about 1000 Å.

Thereafter, the conductive layer 218 is formed to a thickness sufficient to fill the openings 108 of the polymer layer 106 as illustrated in FIG. 2. In an embodiment, the conductive layer 218 may be a conductive material, such as copper, tungsten, or other conductive material, formed by, for example, electroplating, electroless plating, or the like.

FIG. 3 illustrates mounting the die onto a carrier 320 in accordance with an embodiment. In embodiments in which the die is formed as part of a wafer, the individual dies may be singulated by sawing, lasing, a combination thereof, or the like along scribe lines between adjacent dies. In an embodiment, the substrate 100 is mounted onto the carrier 320 using an adhesive. For example, the carrier 320 may comprise a die attach film (DAF), and the carrier 320 may include a carrier substrate having a DAF attached thereto.

FIG. 3 illustrates a single die placed onto the carrier 320 for illustrative purposes only. In other embodiments, multiple dies may be placed onto the carrier 320, thereby forming a single package having multiple dies. In other embodiments, a plurality of dies may be mounted on the carrier 320 and processed. After processing, the plurality of dies may be separated into multiple packages, wherein each package includes one or more individual dies.

Thereafter, a molding material 322 is formed over the substrate 100, e.g., a die. The molding material 322 comprises a molding compound and may comprise epoxy, an organic polymer, or a polymer with a silica-based filler added, as examples. In some embodiments, the molding material 322 comprises a liquid molding compound (LMC) that is a gel-type liquid when applied. Alternatively, the molding material 322 may comprise other insulating materials. In an embodiment, the molding material 322 is formed over a top surface of the conductive layer 218 to a thickness of about 40 um to about 60 um.

In FIG. 4, a planarization process, such as a grinding process (e.g., CMP or mechanical grinding), may be performed on molding material 322 and the conductive layer 218 to form pillars 430. As illustrated in FIG. 4, the pillars 430 may have a height H1 above the conductive pads 102 of between about 2 μm and about 5 μm. The small height H1 is achievable in part by forming the molding material 322 over the conductive layer 218 and the polymer layer 106. The difference in the grinding rate between the molding material 322 and the conductive layer 218/polymer layer 106 is relatively large, such that the conductive layer 218/polymer layer 106 can act as a stop layer for the grinding process. As a result, wherein previous systems had a pillar height of about 10 μm due to the difficulty in controlling the grinding processes, the method such as those discussed above allow a much smaller pillar height, and accordingly, a much smaller package. In an embodiment, the pillars 430 have an exposed surface width W1 of about 5 μm to about 40 μm.

Figure 5:
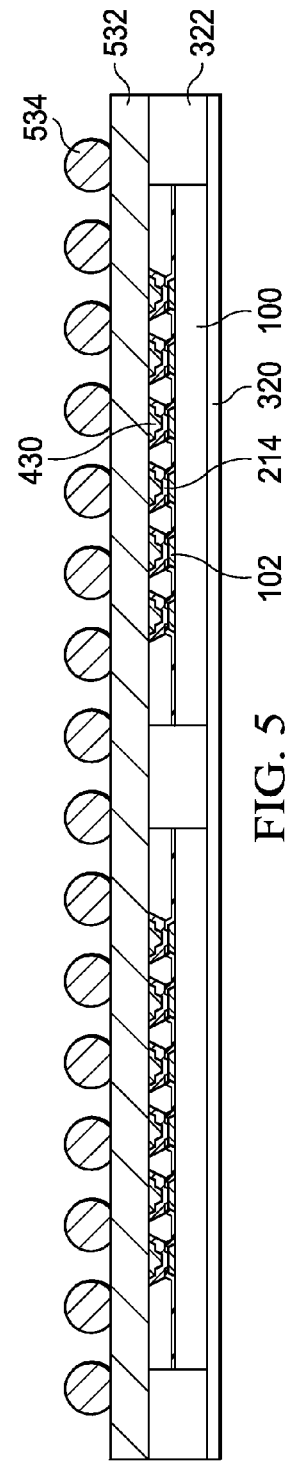

FIG. 5 illustrates formation of a RDL 532 and external connectors 534 electrically coupled to the pillars 430 in accordance with an embodiment. FIG. 5 illustrates an embodiment in which the RDL 532 is formed over and interconnecting two substrates (e.g., chips), although any number of chips may be used, such as one chip or three or more chips. Generally, the RDL 532 may comprise one or more conductive layers formed of metals such as aluminum, copper, tungsten, titanium, and combinations thereof interposed between dielectric layers. The RDL 532 may be formed by depositing the metal layers through chemical vapor deposition, electroplating, or electroless plating and then etching the undesired portions, leaving the RDL 532. The metal layer thickness in RDL 532 may be between about 1 μm and about 12 μm.

However, other materials and process, such as a well-known damascene process, could alternatively be used to form the RDL 532.

Optionally, in an embodiment the RDL 532 may be formed not only over the chips, but may also be formed over the molding material 322. By forming the RDL 532 over the molding material 322, a fan-out area for the chips may be extended beyond the boundaries of the chips, which also allows for an increase in the I/O counts.

The external connectors 534 may be contact bumps such as microbumps or controlled collapse chip connection (C4) bumps and may comprise a material such as tin, or other suitable materials, such as silver or copper. In an embodiment in which the external connectors 534 are tin solder bumps, the second external connectors 534 may be formed by initially forming a layer of tin through any suitable method such as evaporation, electroplating, printing, solder transfer, ball placement, or the like. Once a layer of tin has been formed on the structure, a reflow is performed in order to shape the material into the desired bump shape.

Accordingly, FIG. 5 illustrates an embodiment of a semiconductor device having one or more substrates 100, e.g., integrated circuit dies, interposers, or the like, having a polymer layer 106 thereon. Conductive pillars 430 and/or liners 214 extend through the polymer layer 106 to provide an electrical contact to respective ones of the conductive pads 102 of the substrates 100, wherein the conductive pillars 430 have tapered sidewalls that slope away from a center of the conductive pillars 430 as the conductive pillars 430 extends away from the substrates 100. A molding material 322 is located between adjacent substrates 100 and along an outer periphery. A RDL 532 overlies the substrates 100 and/or the molding material 322, and external connectors 534 are electrically coupled to the RDL 532 to provide an electrical connection to the substrates 100.

Figure 6:
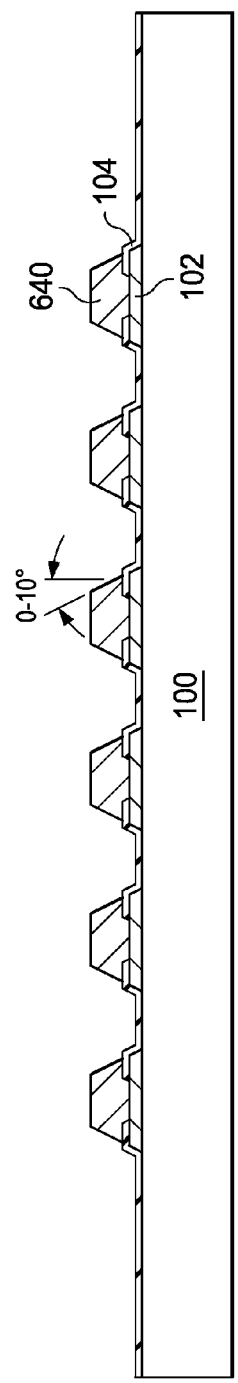
FIGS. 6-10 illustrate intermediate stages in forming a semiconductor device in accordance with an embodiment.

FIGS. 6-10 illustrate various intermediate stages of fabrication of a semiconductor device with thin pillars formed therein in accordance with another embodiment. FIGS. 6-10 use similar layers and materials wherein like reference numerals refer to like elements. Referring first to FIG. 6, there is shown the substrate 100 having the conductive pads 102, and the passivation layer 104 formed thereon. The substrate 100, the conductive pads 102, and the passivation layer 104 may be formed using similar processes and materials as discussed above.

Wherein the embodiment illustrated above with reference to FIGS. 1-5 formed the pillars 430 after forming the polymer layer 106, in the embodiment illustrated in FIG. 6 forms the pillars 640 prior to forming the polymer layer 106. In an embodiment, the pillars 640 are formed by depositing a seed layer, depositing a mask layer, patterning the mask layer to define openings corresponding to the pillars 640, forming the pillars, and removing the mask layer and the excess seed layer material.

For example, after forming the passivation layer 104, a conformal seed layer is deposited over the surface of the passivation layer 104 and exposed portions of the conductive pads 102. The seed layer is a thin layer of a conductive material that aids in the formation of a thicker layer during subsequent processing steps. In an embodiment, the seed layer may be formed by depositing a thin conductive layer, such as a thin layer of Cu, Ti, Ta, TiN, TaN, and/or the like, using CVD or PVD techniques. For example, in an embodiment, the seed layer comprises a layer of Ti deposited by a PVD process and a layer of Cu deposited by a PVD process.

Thereafter, a patterned mask is formed over the seed layer and patterned to form openings corresponding to the desired shape and placement of the pillars 640 such that the patterned mask acts as a mold for forming pillars in subsequent processing steps. The patterned mask may be a patterned photoresist mask, hard mask, or the like. As indicated by the shape of the pillars 640, the patterned mask has a pattern in which the openings decrease in width as the opening extends away from the conductive pads 102. In an embodiment in which the patterned mask comprises a photoresist material, the process conditions of, for example, the exposure and developing may be controlled in which the cross linking of the PR is stronger at the top and weaker at the bottom. As the result, the opening after developing increases in size as the opening extends into the patterned mask. In an embodiment, sidewalls of the openings are vertical or slanted to provide pillars having a sidewall angle from about 0° to about 10° relative to a major surface of the substrate 100 as illustrated in FIG. 6.

Conductive pillars 640 are then formed in the openings of the patterned mask by electroplating, electroless plating, or the like using a conductive material such as copper, tungsten, or other conductive materials.

After forming the pillars 640, the patterned mask and excess materials of the seed layer is removed. In an embodiment in which the patterned mask is a photoresist, an $O_2$ plasma ashing process, or wet strip process may be used to remove the patterned mask. The exposed portions of the seed layer may be removed by, for example, a wet etching process such as a wet dip in a chemical solution of phosphoric acid ($H_3PO_4$) and hydrogen peroxide ($H_2O_2$), referred to as DPP, with 2% hydrofluoric (HF) acid, or another cleaning process, may be used. Optionally, a wet dip in a sulfuric acid ($H_2SO_4$) solution may be used to clean the wafer and remove the remaining photoresist material.

Figure 7:
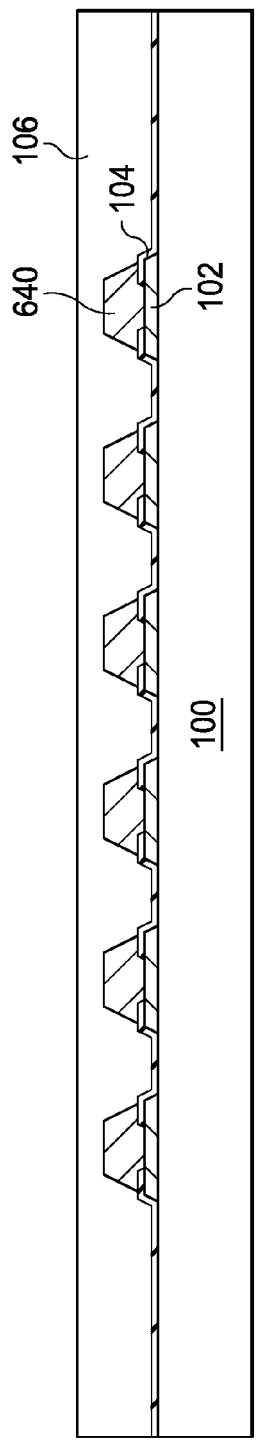

Referring now to FIG. 7, the polymer layer 106 is formed over the passivation layer 104 and the pillars 640. In an embodiment, the polymer layer 106 is formed to a thickness sufficient to cover the pillars 640. As will be explained in greater detail below, the polymer layer 106 will be used as a stop layer in a planarization or grinding process. The polymer layer 106 over the pillars 640 will be removed without removing substantial portions of the pillars 640 by controlling the over-etch process. Such a technique as this allows for thinner pillars.

The polymer layer 106 may be formed using similar processes and materials as described above.

Figure 8:
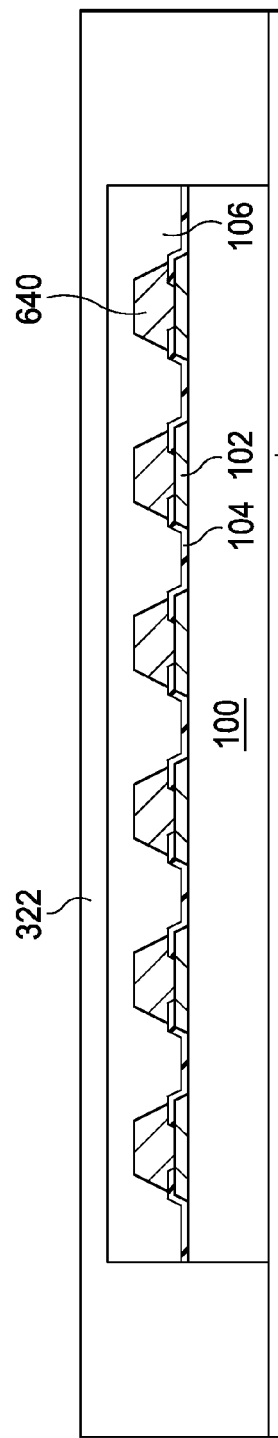

FIG. 8 illustrates mounting the die onto the carrier 320 in accordance with an embodiment. In embodiments in which the die is formed as part of a wafer, the individual dies may be singulated by sawing, lasing, a combination thereof, or the like along scribe lines between adjacent dies. In an embodiment, the substrate 100 is mounted onto the carrier 320.

Similar to FIG. 3, FIG. 8 illustrates a single die placed onto the carrier 320 for illustrative purposes only. In other embodiments, multiple dies may be placed onto the carrier 320, thereby forming a single package having multiple dies. In other embodiments, a plurality of dies may be mounted on the carrier 320 and processed. After processing, the plurality of dies may be separated into multiple packages, wherein each package includes one or more individual dies.

Thereafter, the molding material 322 is formed over the substrate 100, e.g., a die. The molding material 322 may be formed using similar processes and materials as discussed above. In an embodiment, the molding material 322 is formed over a top surface of the polymer layer 106 to a thickness of about 40 um to about 60 um.

Figure 9:
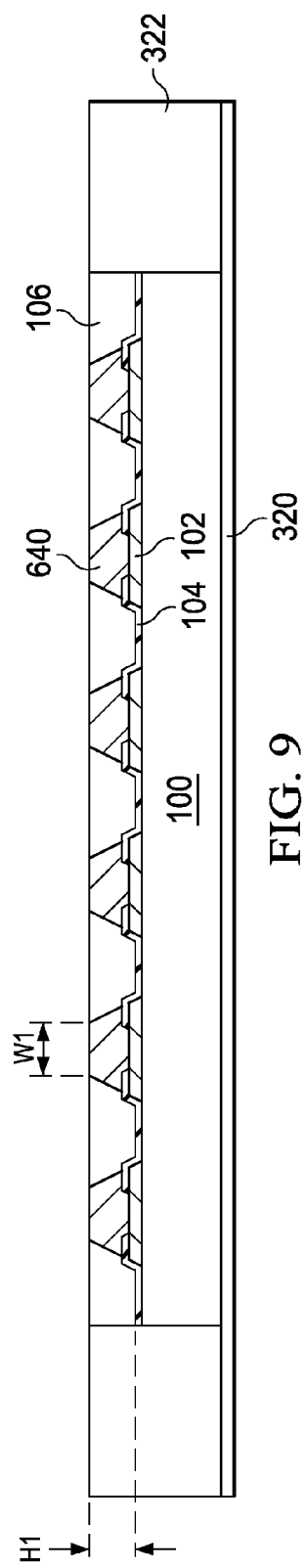

FIG. 9 illustrates the device after a planarization process, such as a grinding process (e.g., a CMP or mechanical grinding), has been performed on molding material 322 and the polymer layer 106 to expose the pillars 640. The polymer layer 106 acts as a stop layer in a planarization or grinding process to remove the molding material 322. The over-etch process is controlled such that the polymer layer 106 over the pillars 640 is removed without removing substantial portions of the pillars 640, thereby allowing for thinner pillars to be used.

For example, as illustrated in FIG. 9, the pillars 640 may have a height H1 above the conductive pads 102 of between about 2 µm and about 5 µm and an upper surface width W1 of about 5 µm to about 40 µm. The small height H1 is achievable in part by forming the molding material 322 over the polymer layer 106. The difference in the grinding rate between the molding material 322 and the polymer layer 106 is relatively large, such that the polymer layer 106 acts as a stop layer for the grinding process. As a result, wherein previous systems had a pillar height of about 10 µm due to the difficulty in controlling the grinding processes, the method such as those discussed above allow a much smaller pillar height, and accordingly, a much smaller package.

Figure 10:
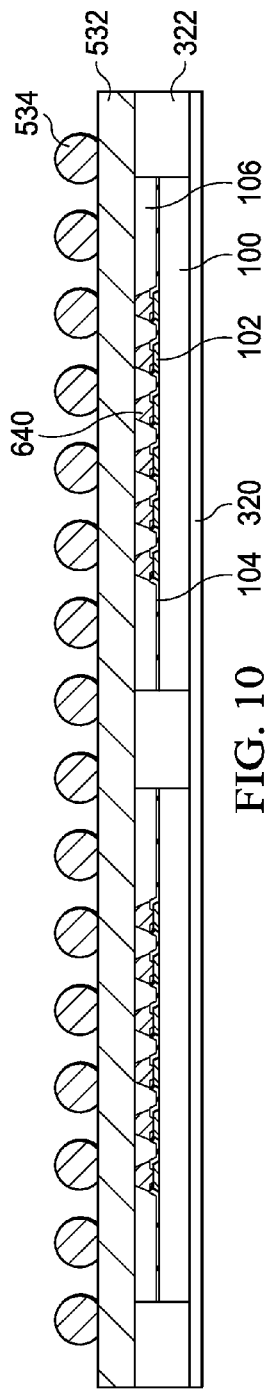

FIG. 10 illustrates formation of a RDL 532 and external connectors 534 electrically coupled to the pillars 640 in accordance with an embodiment. The RDL 532 and the external connectors 534 may be formed using similar processes and materials as discussed above.

Accordingly, FIG. 10 illustrates an embodiment of a semiconductor device having one or more substrates 100, e.g., integrated circuit dies, interposers, or the like, having a polymer layer 106 thereon. Conductive pillars 640 extend through the polymer layer 106 to provide an electrical contact to respective ones of the conductive pads 102 of the substrates 100, wherein the conductive pillars 430 have tapered sidewalls that slope toward a center of the conductive pillars 430 as the conductive pillars 430 extends away from the substrates 100. A molding material 322 is located between adjacent substrates 100 and along an outer periphery. A RDL 532 overlies the substrates 100 and/or the molding material 322, and external connectors 534 are electrically coupled to the RDL 532 to provide an electrical connection to the substrates 100.

Figure 11:
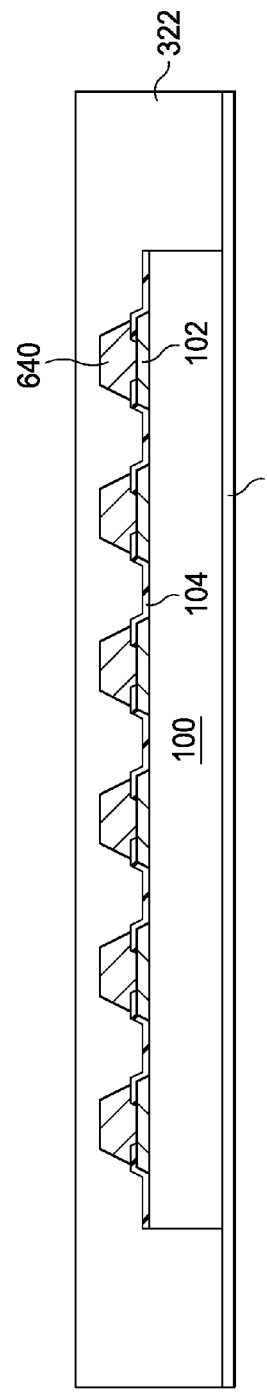
Figure 12:
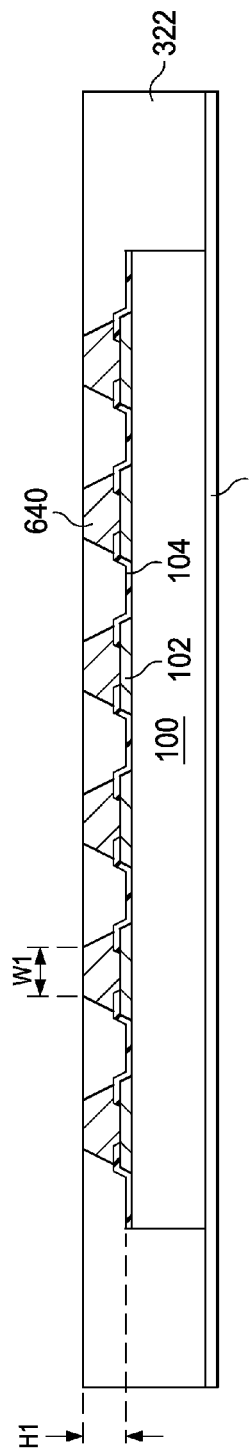

FIGS. 11-13 illustrate various intermediate stages of another method of forming a semiconductor device with thin pillars formed therein in accordance with another embodiment. FIGS. 11-13 use similar layers and materials wherein like reference numerals refer to like elements and assume processes similar to those discussed above with reference to 6 have been performed. Accordingly, FIG. 11 illustrates the structure discussed above with reference to FIG. 6, except a height of the pillars may be greater as discussed below, having a molding material 322 formed over passivation layer 104 and the conductive pillars 640. The molding material 322 may be formed using similar materials and processes as discussed above with reference to FIG. 8.

FIG. 12 illustrates the device after a planarization process, such as a grinding process (e.g., a chemical-mechanical polish (CMP) or mechanical grinding), has been performed on molding material 322 to expose the pillars 640. In comparison to the embodiment discussed above with reference to FIGS. 6-10, the current embodiment does not utilize the polymer layer 106, but rather the molding material 322 is formed over the passivation layer 104. As such, the grinding process is not able to use the passivation layer 104 as a stop layer. In some embodiments, it may be desirable to increase the height H1 of the pillar 640, such as a height H1 from about 2 µm to about 10 µm, to ensure there is sufficient height present for the grinding process. It should be noted that the height of the pillar 640 may be decreased more during the grinding process in this embodiment than in embodiments utilizing the polymer layer 106. In an embodiment, the pillar 640 has an upper surface width W1 of about 5 µm to about 40 µm.

FIG. 13 illustrates formation of the RDL 532 and external connectors 534 electrically coupled to the pillars 640 in accordance with an embodiment. The RDL 532 and the external connectors 534 may be formed using similar processes and materials as discussed above.

Accordingly, FIG. 13 illustrates an embodiment of a semiconductor device having one or more substrates 100, e.g., integrated circuit dies, interposers, or the like, having a molding material 322 over a connection side of the substrates 100 and along sidewalls of the substrates 100. Conductive pillars 640 extend through the molding material 322 to provide an electrical contact to respective ones of the conductive pads 102 of the substrates 100, wherein the conductive pillars 640 have tapered sidewalls that slope toward a center of the conductive pillars 640 as the conductive pillars 640 extends away from the substrates 100. A RDL 532 overlies the substrates 100 and/or the molding material 322, and external connectors 534 are electrically coupled to the RDL 532 to provide an electrical connection to the substrates 100.

FIGS. 14-17 illustrate various intermediate stages of fabrication of a semiconductor device with thin vias formed therein in accordance with another embodiment. FIGS. 14-17 use similar layers and materials wherein like reference numerals refer to like elements. Referring first to FIG. 14, there is shown the substrate 100 having an ellipsoidal bump 1450 formed thereon. In an embodiment, the ellipsoidal bump 1450 is formed by, for example electroless plating techniques, to selectively form the ellipsoidal bumps 1450 on the conductive pads 102 and extend over adjacent surfaces of the passivation layer 104. Because the passivation layer 104 is formed of a non-conductive material, the ellipsoidal bumps 1450 are formed only on exposed portions of the conductive pads 102. In an embodiment, the ellipsoidal bumps 1450 are formed of a conductive material, such as Ni, Pd, Au, and Cu, to a thickness of about 3 µm to about 15 µm. As illustrated in FIG. 14, in an embodiment, a ratio of a height a of the ellipsoidal bump 1450 above an upper surface of the passivation layer 104 to an amount of an overlap b of the ellipsoidal bump 1450 on the passivation layer 104 is about 1:0.7 to about 1:1.

FIG. 15 illustrates the molding material 322 formed over passivation layer 104 and the ellipsoidal bumps 1450. The molding material 322 may be formed using similar materials and processes as discussed above with reference to FIG. 8.

FIG. 16 illustrates the device after a planarization process, such as a grinding process (e.g., a CMP or mechanical grinding), has been performed on molding material 322 to expose portions of the ellipsoidal bumps 1450. In some embodiments, upper portions of the ellipsoidal bumps 1450 are flattened as part of the grinding process, as illustrated in FIG. 16.

In an embodiment, a ratio of a height a' of the ellipsoidal bump 1450 above an upper surface of the passivation layer 104 to an amount of an overlap b of the ellipsoidal bump 1450 on the passivation layer 104 after the grinding process is about 1:1 to about 1:1.4. In an embodiment, a height H1 of the ellipsoidal bump 1450 above the conductive pads 102 is about 2 µm to about 5 µm and an upper surface width W1 of about 5 µm to about 40 µm.

Figure 17:
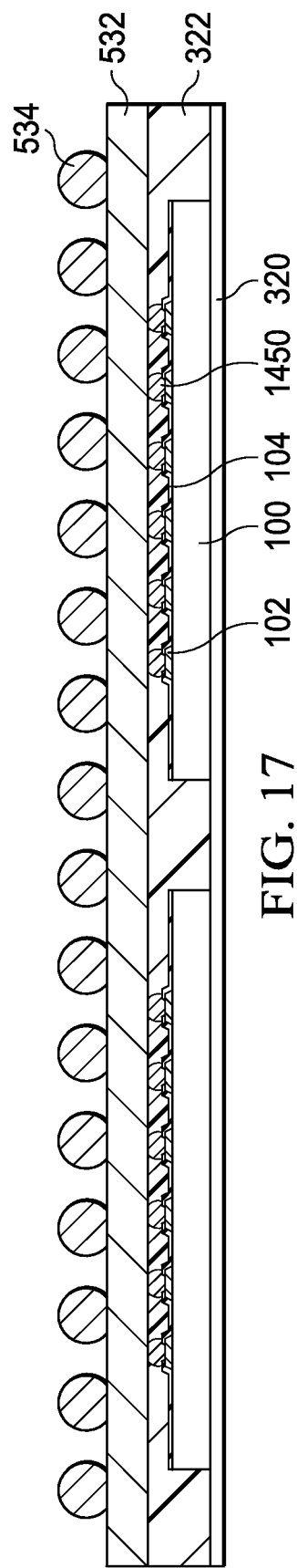

FIG. 17 illustrates formation of the RDL 532 and external connectors 534 electrically coupled to the ellipsoidal bumps 1450 in accordance with an embodiment. The RDL 532 and the external connectors 534 may be formed using similar processes and materials as discussed above.

Accordingly, FIG. 17 illustrates an embodiment of a semiconductor device having one or more substrates 100, e.g., integrated circuit dies, interposers, or the like, having a molding material 322 over a connection side of the substrates 100 and along sidewalls of the substrates 100. Ellipsoidal bumps 1450 extend through the molding material 322 to provide an electrical contact to respective ones of the conductive pads 102 of the substrates 100. A RDL 532 overlies the substrates 100 and/or the molding material 322, and external connectors 534 are electrically coupled to the RDL 532 to provide an electrical connection to the substrates 100.

Figure 18:
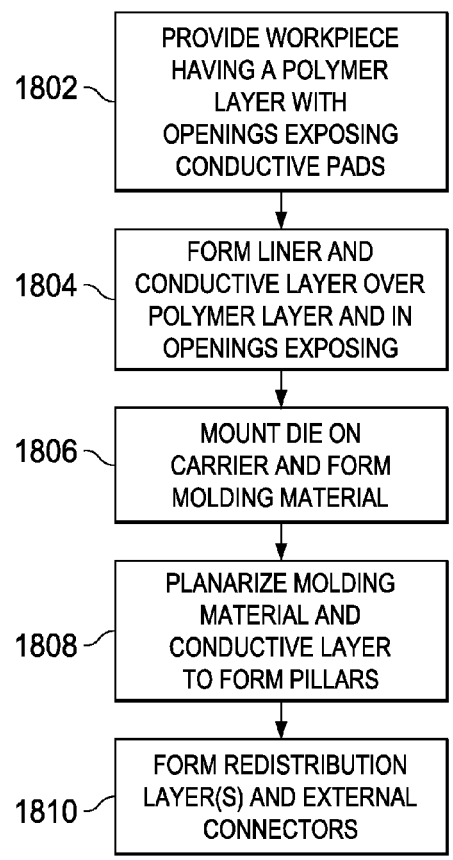
FIG. 18 is a flowchart illustrating a method of forming a semiconductor device in accordance with an embodiment.

FIG. 18 is a flowchart illustrating a method of forming a semiconductor device in accordance with an embodiment. The method begins in step 1802, wherein a workpiece is provided having a polymer layer with openings exposing underlying conductive pads, such as that discussed above with reference to FIG. 1. Next, in step 1804, a liner layer and a conductive layer are formed over and in the openings of the polymer layer, such as that discussed above with reference to FIG. 2. In step 1806, individual dies are placed onto a carrier and a molding material is formed over the dies, such as that discussed above with reference to FIG. 3. Thereafter, in step 1808, a planarization process is performed to remove excess portions of the molding material and the conductive layer to form pillars, such as that discussed above with reference to FIG. 4. One or more redistribution layers and external connections are formed, such as that discussed above with reference to FIG. 5, in step 1810.

Figure 19:
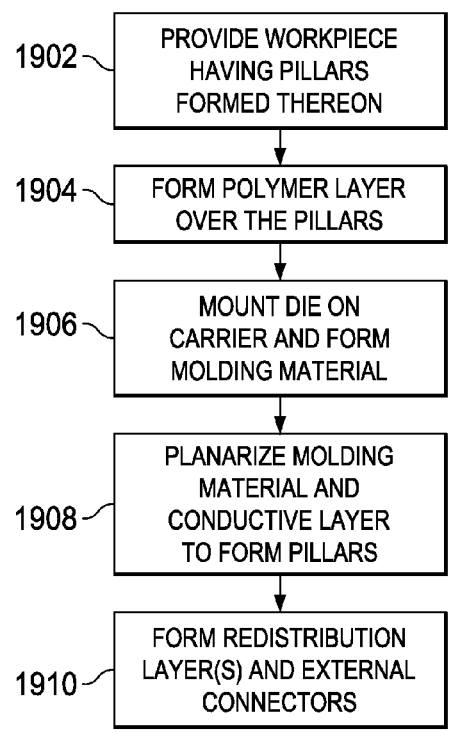
FIG. 19 is a flowchart illustrating a method of forming a semiconductor device in accordance with an embodiment.

FIG. 19 is a flowchart illustrating a method of forming a semiconductor device in accordance with an embodiment. The method begins in step 1902, wherein a workpiece is provided having pillars formed thereon, such as that discussed above with reference to FIG. 6. Next, in step 1904, a polymer layer is formed over the pillars, such as that discussed above with reference to FIG. 7. In step 1906, individual dies are placed onto a carrier and a molding material is formed over the dies, such as that discussed above with reference to FIG. 8. Thereafter, in step 1908, a planarization process is performed to remove excess portions of the molding material and the polymer layer to expose the pillars, such as that discussed above with reference to FIG. 9. One or more redistribution layers and external connections are formed, such as that discussed above with reference to FIG. 10, in step 1910.

Figure 20:
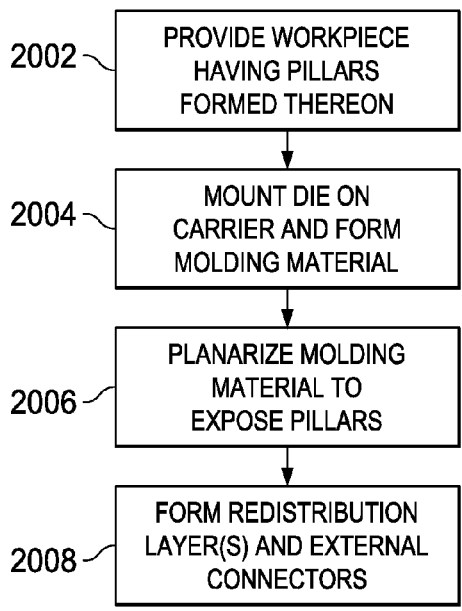
FIG. 20 is a flowchart illustrating a method of forming a semiconductor device in accordance with an embodiment.

FIG. 20 is a flowchart illustrating a method of forming a semiconductor device in accordance with an embodiment. The method begins in step 2002, wherein a workpiece is provided having pillars formed thereon, such as that discussed above with reference to FIG. 6. Next, in step 2004, individual dies are placed onto a carrier and a molding material is formed over the dies, such as that discussed above with reference to FIG. 11. Thereafter, in step 2006, a planarization process is performed to remove excess portions the molding material to expose the pillars, such as that discussed above with reference to FIG. 12. One or more redistribution layers and external connections are formed, such as that discussed above with reference to FIG. 13, in step 2008.

Figure 21:
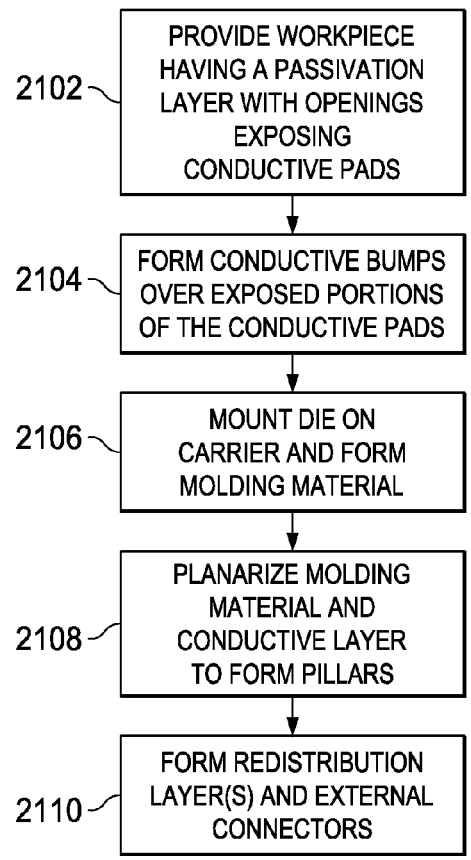
FIG. 21 is a flowchart illustrating a method of forming a semiconductor device in accordance with an embodiment.

FIG. 21 is a flowchart illustrating a method of forming a semiconductor device in accordance with an embodiment. The method begins in step 2102, wherein a workpiece is provided having a passivation layer with openings exposing underlying conductive pads, such as that discussed above with reference to FIG. 14. Next, in step 2104, conductive bumps are formed over exposed portions of the conductive pads, such as that discussed above with reference to FIG. 14. In step 2106, individual dies are placed onto a carrier and a molding material is formed over the dies, such as that discussed above with reference to FIG. 15. Thereafter, in step 2108, a planarization process is performed to remove excess portions of the molding material and expose the conductive bumps, such as that discussed above with reference to FIG. 16. One or more redistribution layers and external connections are formed, such as that discussed above with reference to FIG. 17, in step 2110.

In an embodiment, a method of forming a device is provided. The method includes providing a die having a passivation layer formed thereon and a polymer layer over the passivation layer. The die further includes a conductive layer over the polymer layer, the conductive layer extending through openings in the passivation layer and the polymer layer such that the conductive layer is in electrical contact with underlying conductive pads. The die is mounted on a carrier, and a molding compound is formed over the conductive layer of the die and along sidewalls of the die. A planarizing process, such as a grinding, is performed on an upper surface of the molding compound and the die to remove the conductive layer over the polymer layer and to form pillars from the conductive layer extending through the polymer layer.

In another embodiment, another method of forming a device is provided. The method includes providing a die having a passivation layer formed thereon, wherein the passivation layer has openings over underlying conductive pads. The die also has conductive pillars extending through respective ones of the openings and a polymer layer covering conductive pillars. The die is mounted on a carrier, and a molding compound is formed over the polymer layer and along sidewalls of the die. A planarizing process is performed on the molding compound and the polymer layer to expose the conductive pillars.

In yet another embodiment, another method of forming a device is provided. The method includes providing a die having a passivation layer formed thereon, the passivation layer having openings over conductive pads. The die further includes conductive elements extending through respective ones of the opening and extending above an uppermost surface of the passivation layer. The die is mounted on a carrier, and a molding compound is formed over the passivation layer of the die and along sidewalls of the die. A planarizing process is performed on an upper surface of the molding compound to expose the conductive elements.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a device, the method comprising:
    providing a die having a passivation layer formed thereon and a polymer layer over the passivation layer, the die further having a conductive layer over the polymer layer, the conductive layer extending through openings in the passivation layer and the polymer layer such that the conductive layer is in electrical contact with underlying conductive pads;

mounting the die on a carrier;

forming a molding compound over the conductive layer and along sidewalls of the die; and planarizing the molding compound and the conductive layer to remove the conductive layer over the polymer layer and to form pillars from the conductive layer extending through the polymer layer.

2. The method of claim 1, wherein the providing comprises:

forming the passivation layer over the die, the passivation layer having openings over respective ones of the conductive pads;

forming the polymer layer over the passivation layer, the polymer layer having openings over respective ones of the conductive pads;

forming a liner over the polymer layer and in the openings; and forming the conductive layer over liner, the conductive layer being in electrical contact with the conductive pads.

3. The method of claim 1, wherein the providing comprises forming a layer of polymer material, and patterning the layer of polymer material to form openings over respective ones of the conductive pads, thereby forming the polymer layer, the openings having tapered sidewalls with an angle of about 5° to about 30°.

4. The method of claim 1, wherein the planarizing comprises thinning the conductive layer to a height above the conductive pads of about 2 μm to about 5 μm.

5. The method of claim 1, wherein a width of the pillars increases as the pillars extend away from the conductive pads.

6. The method of claim 1, further comprising forming a redistribution layer over the polymer layer after the planarizing.

7. The method of claim 6, wherein the forming the redistribution layer comprises forming the redistribution layer over the molding compound.

8. A method of forming a device, the method comprising:

providing a die having a passivation layer formed thereon, the passivation layer having first openings over conductive pads;

forming a polymer layer covering the passivation layer, the polymer layer having second openings over the conductive pads;

forming one or more conductive layers over the polymer layer, the one or more conductive layers extending through the first openings and the second openings;

mounting the die on a carrier;

forming a molding compound over the one or more conductive layers; and planarizing an upper surface of the molding compound and the one or more conductive layers, thereby forming conductive pillars in respective ones of the first openings and second openings.

9. The method of claim 8, wherein forming the molding compound comprises forming the molding compound along sidewalls of the die.

10. The method of claim 8, further comprising singulating the die from a wafer.

11. The method of claim 8, wherein the second openings having tapered sidewalls with an angle of about 5° to about 30°.

12. The method of claim 8, wherein the planarizing comprises thinning the conductive layer to a height above the conductive pads of about 2 μm to about 5 μm.

13. The method of claim 8, wherein a width of the conductive pillars increases as the pillars extend away from the conductive pads.

14. A method of forming a device, the method comprising:

providing a die having a first insulating layer formed thereon, the first insulating layer having first openings over conductive pads;

forming a second insulating layer covering the first insulating layer, the second insulating layer having second openings over the conductive pads;

forming one or more conductive layers over the second insulating layer, the one or more conductive layers extending through the first openings and the second openings;

forming a molding compound over the one or more conductive layers; and planarizing an upper surface of the molding compound and the one or more conductive layers, thereby forming conductive pillars in respective ones of the first openings and second openings.

15. The method of claim 14, further comprising forming a redistribution layer over the second insulating layer after the planarizing.

16. The method of claim 15, wherein the forming the redistribution layer comprises forming the redistribution layer over the molding compound.

17. The method of claim 14, wherein the second insulating layer comprises a polymer layer.

18. The method of claim 14, further comprising singulating the die from a wafer.

19. The method of claim 14, further comprising attaching the die to a carrier substrate.

20. The method of claim 14, wherein a width of the conductive pillars increases as the pillars extend away from the conductive pads.

* * * * *